United States Patent [19]

Seevinck

[11] Patent Number: 5,241,504
[45] Date of Patent: Aug. 31, 1993

[54] INTEGRATED MEMORY COMPRISING A SENSE AMPLIFIER

[75] Inventor: Evert Seevinck, Eindhoven, Netherlands

[73] Assignee: U.S. Philips Corp., New York, N.Y.

[21] Appl. No.: 927,781

[22] Filed: Aug. 10, 1992

Related U.S. Application Data

[63] Continuation of Ser. No. 844,996, Mar. 2, 1992, abandoned, which is a continuation of Ser. No. 758,446, Sep. 5, 1991, abandoned, which is a continuation of Ser. No. 525,289, May 17, 1990, abandoned.

[30] Foreign Application Priority Data

May 29, 1989 [NL] Netherlands ............ 8901344

[51] Int. Cl.$^5$ ............ G11C 7/06; H03K 5/22
[52] U.S. Cl. ............ 365/205; 365/206; 365/207; 365/208; 307/530
[58] Field of Search ............ 365/156, 190, 205, 206, 365/207, 208; 307/355, 530

[56] References Cited

U.S. PATENT DOCUMENTS

| | | | |
|---|---|---|---|
| 4,069,475 | 1/1978 | Boettcher | 365/208 |
| 4,223,394 | 9/1980 | Pathak et al. | 365/207 |
| 4,253,163 | 2/1981 | Komoriya et al. | 365/207 |
| 4,396,845 | 8/1983 | Nakano | 365/205 |
| 4,479,202 | 10/1984 | Uchida | 365/205 |
| 4,697,112 | 9/1987 | Ohtani et al. | 307/530 |
| 4,716,320 | 12/1987 | McAdams | 365/205 |
| 4,739,198 | 4/1988 | Maruyama | 365/208 |
| 4,831,588 | 5/1989 | Ducourant et al. | 365/207 |
| 4,871,978 | 10/1989 | Galbraith | 307/530 |
| 4,973,864 | 11/1990 | Nogami | 365/205 |
| 5,012,450 | 4/1991 | Mattausch et al. | 365/189.11 |
| 5,017,815 | 5/1991 | Shah et al. | 365/205 |

Primary Examiner—Joseph L. Dixon
Assistant Examiner—Jack A. Lane
Attorney, Agent, or Firm—Steven R. Biren

[57] ABSTRACT

An integrated memory includes a sense amplifier which has a parallel connection of a first and a second current branch, each current branch including channels of a control transistor and a load transistor which are coupled via a junction point, the junction points in each current branch being cross-wise coupled to the gates of the load transistors in the other current branch, and the junction points constituting outputs of the sense amplifier. The control and load transistors are of the same conductivity type, with each load transistor being connected in a source-follower configuration with its associated control transistor. As a result, the control transistors will be operative in the saturation region at all times and can be driven to full output, so that an integrated memory incorporating the invention is faster.

5 Claims, 1 Drawing Sheet

INTEGRATED MEMORY COMPRISING A SENSE AMPLIFIER

This is a continuation of application Ser. No. 07/844,996 filed on Mar. 2, 1992 now abandoned, which is a continuation of application Ser. No. 07/758,446, filed Sept. 5, 1991, now abandoned, which is a continuation of application Ser. No. 07/525,289, filed May 17, 1990, now abandoned.

BACKGROUND OF THE INVENTION

The invention relates to an integrated field-effect transistor memory comprising a sense amplifier which includes a parallel connection of a first and a second current branch, each current branch comprising a channel of a control transistor and a channel of a load transistor, which channels are coupled via a junction point, the junction point in each current branch being coupled to the gate of the load transistor in the other current branch, at least one of said junction points constituting an output of the sense amplifier.

An integrated memory of this kind is known from JP Kokai 61-96587. The memory described therein comprises sense amplifiers in which the channels of two cross-wise coupled P-type field-effect transistors Q3 and Q4 are connected to the supply voltage VDD and the drains of respective N-type field-effect transistors Q1 and Q2. The bit line voltages in integrated memory circuits usually approximate the positive supply voltage. Consequently, sense amplifiers of this kind have the drawback that the voltages on the drains of the transistors Q1 and Q2 may decrease only from 1 to 2 V below the positive supply voltage in order to ensure that the control transistors Q1 and Q2 are operative exclusively in the saturation zone so as to achieve an optimum operating speed. In the event of disturbances (VDD bumps) in the positive supply voltage in the negative direction in the known sense amplifiers, however, the setting of at least one of the transistors Q1 and Q2 will still leave the saturation zone, so that such sense amplifiers become slower.

SUMMARY OF THE INVENTION

It is inter alia an object of the invention to provide an integrated memory circuit which is faster and whose speed is not dependent or at least less dependent on negative bumps in the positive supply voltage.

To achieve this, an integrated memory circuit in accordance with the invention is characterized in that the control and load transistors are of the same conductivity type, the control transistor being connected in a source-follower configuration, the relevant load transistor being connected to the source of the relevant control transistor. Because the outputs of the sense amplifier are thus connected to the sources of the control transistors, the drains of these transistors may be coupled to a supply voltage. As a result, the control transistors will always be operative in the saturation zone and can always be driven to full output, so that an integrated memory in accordance with the invention is faster. Because the load transistors are cross-wise coupled, the sense amplifier in the integrated memory in accordance with the invention has a high gain.

An embodiment of an integrated memory in accordance with the invention is characterized in that a width/length ratio (W/L) of the load transistor in each current branch is no more than twice the width/length ratio (W/L) of the control transistor in the relevant current branch. Simulations have demonstrated that the voltages on the outputs of the sense amplifier are thus not latched to one of the supply voltages. This offers the advantage that a sense amplifier in accordance with the invention is a self-restoring type, i.e. the voltage on the output of the sense amplifier automatically follows the voltage on its input when a new input signal is presented; this is advantageous inter alia in view of the control and timing of selection signals.

Another embodiment of an integrated memory in accordance with the invention is characterized in that said width/length ratios (W/L) are substantially equal. As a result, the same dimensions can be chosen for the load transistors and the control transistors, so that the chip lay-out of such a sense amplifier is very simple.

Another embodiment of an integrated memory, comprising several sense amplifiers which are connected to a same bus at the output side, and also comprising a selection circuit for selecting a single sense amplifier in accordance with the invention, is characterized in that the selection circuit comprises a first and a second selection transistor in each sense amplifier, a channel of said selection transistors being included in the first and the second current branch, respectively, between a supply terminal on the one side and a drain of the respective control transistor on the other side, the coupled gates of said selection transistors receiving a selection signal for the selective activation of a single sense amplifier. When a desired sense amplifier is selected, the relevant selection transistors are driven to full output so that the drains of the control transistors receive the entire or substantially the entire supply voltage. As a result, these transistors continue to operate in the saturation region.

BRIEF DESCRIPTION OF THE DRAWING

The invention will be described in detail hereinafter with reference to the embodiments shown in the drawing, in which.

DESCRIPTION OF THE PREFERRED EMBODIMENTS

Figure 1:
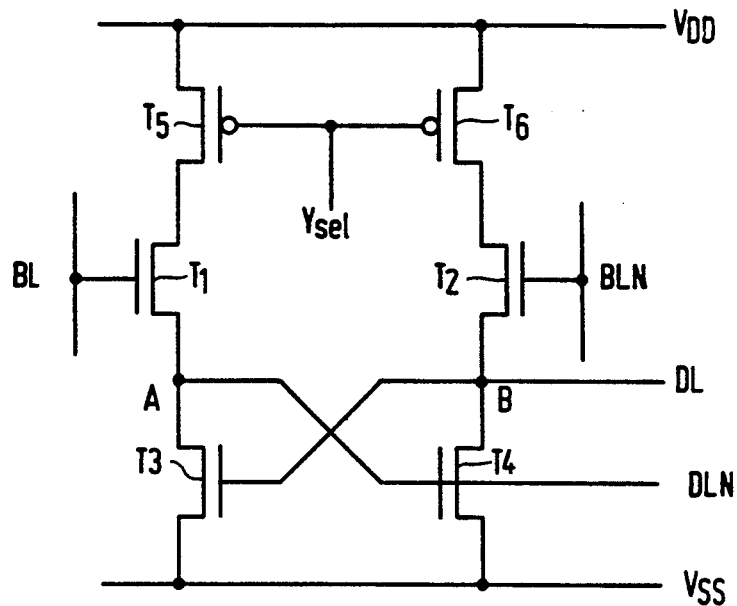
FIG. 1 shows an embodiment of a sense amplifier in accordance with the invention.

FIG. 1 shows an embodiment of a sense amplifier in accordance with the invention. The sense amplifier comprises 4 NMOS-transistors T1, T2, T3 and T4 and 2 PMOS-transistors T5 and T6. The sources of selection transistors T5 and T6 are connected to a supply terminal VDD, the drains of these transistors being connected to the drains of respective control transistors T1 and T2. The sources of the control transistors T1 and T2 are connected to respective junction points A and B and the drains of respective load transistors T3 and T4. The sources of the load transistors T3 and T4 are connected to a supply terminal VSS. The gates of the selection transistors T5 and T6 receive a selection signal YSEL, the gates of the load transistors T3 and T4 being connected to respective junction points B and A. The gates of the control transistors T1 and T2 are coupled to bit lines BL and BLN. The bit lines BL and BLN themselves are connected to memory cells in a memory column which are not shown in the Figure. The selection transistors T5 and T6, however, may also be N-type transistors if their gates receive a sufficiently high selection voltage upon selection of the sense amplifier.

The operation of the circuit shown in FIG. 1 is as follows: when the selection signal YSEL for selecting the sense amplifier shown is logic low, the selection transistors T5 and T6 are turned on. The drains of the control transistors T1 and T2 thus receive the entire or substantially the entire supply voltage VDD. The transistors T1 and T2 are connected as source-followers. The input signals on the bit lines BL and BLN are amplified by means of the transistors T1, T2 and T3, T4 and are available on the junction points A and B. Being source-followers, the transistors T1 and T2 have a gain of approximately 1, but the cross-wise coupled transistors T3 and T4 transfer the signals on the bit lines BL and BLN to the junction points A and B in amplified form. If the width/length ratio (W/L) of the transistors T3 and T4 are no more than twice as large as the W/L ratios of the transistors T1 and T2, the sense amplifier will amplify the signals on the bit lines BL and BLN so that on the output (the junction points A and B) of the sense amplifier the voltages will not be latched to the supply voltage VDD and VSS, or VSS and VDD, respectively. This offers the advantage that such a sense amplifier is a self-restoring type. This means that the voltage on the output of the sense amplifier automatically follows the voltage on its input when a new input signal is presented. Consequently, a sense amplifier in accordance with the invention is faster, because the switching-on and off of the sense amplifier by means of a control signal, as in the sense amplifier described in the cited Japanese reference, can be dispensed with.

Figure 2:
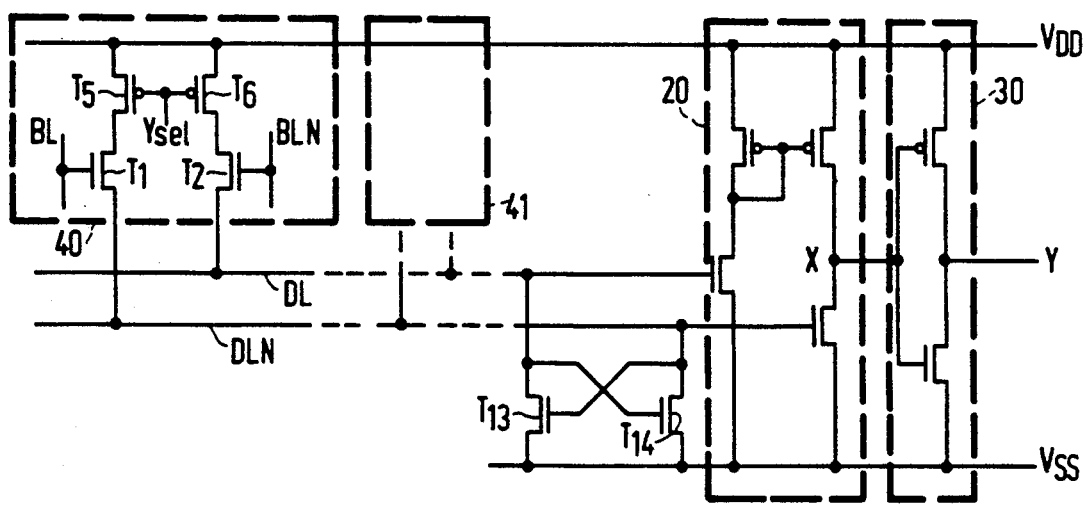
FIG. 2 shows an embodiment of an integrated memory comprising several sense amplifiers in accordance with the invention.

FIG. 2 shows an embodiment of an integrated memory comprising several sense amplifiers 40, 41 etc. in accordance with the invention. Elements in FIG. 2 which correspond to elements of FIG. 1 are denoted by corresponding references. The outputs of the sense amplifiers 40, 41 etc. are connected to the common data lines DL and DLN. The sense amplifiers 41, etc. are constructed in the same way as the sense amplifier 40. The cross-wise coupled transistors T13 and T14, analogous to T3 and T4 shown in FIG. 1, are provided only once in this circuit and are coupled to the data lines DL and DLN. Furthermore, a further amplifier state 20 is connected to the data lines DL and DLN. A buffer circuit 30 which produces an output signal on output Y is connected to output X of the amplifier stage 20.

The operation of the circuit shown in FIG. 2 is as follows: after the selection of a single, desired sense amplifier by means of a selection signal YSEL, the bit line signals of the relevant memory column are applied to the transistors T13 and T14 via the data lines DL and DLN. The signals on these data lines are amplified by the transistors T13 and T14 and applied to the further amplifier stage 20. In this amplifier stage the signals are further amplified and applied to a buffer circuit 30 via the output X. The output Y of the buffer circuit 30 supplies an output signal having CMOS output levels. Because the transistors T13 and T14 are provided only once for several sense amplifiers connected to the data lines DL and DLN, these sense amplifiers comprise only a small number of components so that they require only a small chip surface area and readily fit in the "pitch" of a memory column.

I claim:

1. An integrated field-effect transistor memory comprising a plurality of sense amplifiers, each including a parallel connection of a first and a second current branch, each current branch comprising a channel of a control transistor and a channel of a load transistor, said channels in each branch being coupled at respective junction points, the junction point in each current branch being coupled to a gate of the load transistor in the other current branch, at least one of said junction points comprising a sense amplifier output, wherein said control and load transistors are of the same conductivity type, the control transistors are connected in a source-follower configuration, each load transistor is connected to a source of the control transistor in its current branch, and said plurality of sense amplifiers are coupled to one common pair of load transistors, the load transistors being coupled between a data bus and a first supply terminal, and a selection circuit for the selective activation of a single sense amplifier.

2. The integrated field-effect transistor memory as claimed in claim 1, characterized in that a width/length ratio (W/L) of the load transistor in each current branch is no more than twice the width/length ratio (W/L) of the control transistor in that current branch.

3. The integrated field-effect transistor memory as claimed in claim 2, characterized in that said width/length ratios (W/L) of said load transistor and said control transistor are substantially equal.

4. The integrated field-effect transistor memory as claimed in claim 1, comprising a plurality of sense amplifiers which are connected to said data bus, and a selection circuit for selecting a single sense amplifier, characterized in that the selection circuit comprises a first and a second selection transistor in each sense amplifier, a channel of one of said selection transistors being included in each of the first and the second current branches, respectively, between a supply terminal and a drain of the respective control transistor, the gates of said first and second selection transistors being coupled together and receiving a selection signal for the selective activation of a single sense amplifier.

5. The integrated field-effect transistor memory as claimed in claim 1, in which the selection circuit comprises selection transistors, characterized in that a channel of each selection transistor is connected between a drain of a respective one of said control transistors and a second supply terminal.

* * * * *